(12) United States Patent
Dewa et al.

(10) Patent No.: US 8,531,212 B2
(45) Date of Patent: Sep. 10, 2013

(54) DRIVE CIRCUIT FOR VOLTAGE-CONTROL TYPE OF SEMICONDUCTOR SWITCHING DEVICE

(75) Inventors: Tetsuya Dewa, Anjo (JP); Shinichiro Nakata, Anjo (JP); Yusuke Shindo, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 13/474,045

(22) Filed: May 17, 2012

(65) Prior Publication Data

US 2012/0293218 A1    Nov. 22, 2012

(30) Foreign Application Priority Data

May 18, 2011    (JP) .................................. 2011-111247

(51) Int. Cl.
*H03B 1/00*    (2006.01)
(52) U.S. Cl.
USPC ........................... 327/109; 327/112; 327/108
(58) Field of Classification Search
USPC ........................................ 327/109, 306, 308
See application file for complete search history.

(56) References Cited

U.S. PATENT DOCUMENTS

| | | | |
|---|---|---|---|
| 4,989,127 A | 1/1991 | Wegener | |
| 7,663,420 B2 * | 2/2010 | Araki et al. | 327/308 |
| 8,319,529 B2 * | 11/2012 | Ikeda | 327/109 |
| 8,350,601 B2 * | 1/2013 | Nagata et al. | 327/109 |

FOREIGN PATENT DOCUMENTS

| | | |
|---|---|---|
| JP | 03-003415 | 1/1991 |
| JP | 2003-158868 | 5/2003 |
| JP | 3430878 | 5/2003 |
| JP | 2009-100306 | 5/2009 |
| JP | 2010-041818 | 2/2010 |
| JP | 2010-075007 | 4/2010 |

OTHER PUBLICATIONS

Office Action (2 pages) dated Apr. 23, 2013, issued in corresponding Japanese Application No. 2011-111247 and English translation (3 pages).

* cited by examiner

*Primary Examiner* — Hai L Nguyen
(74) *Attorney, Agent, or Firm* — Nixon & Vanderhye PC

(57) ABSTRACT

A charging current is supplied to the gate (control terminal) of a driven switching device during an on-state command interval, for raising the gate voltage to an on-state value. Otherwise, discharging of the gate capacitance is enabled, for decreasing the gate voltage to an off-state value. A second switching device is connected between the gate and a circuit point held at the off-state voltage value, and is maintained in an on state while the gate discharging is enabled. At a first time point, the gate voltage rises above a threshold value. At a second time point, a voltage detection circuit detects that that the gate voltage has risen above the threshold value, causing the second switching device to be set in the off state. It is ensured that the delay between the first and second time points is shorter than a minimum duration of an on-state command interval.

7 Claims, 7 Drawing Sheets

FIG. 3A
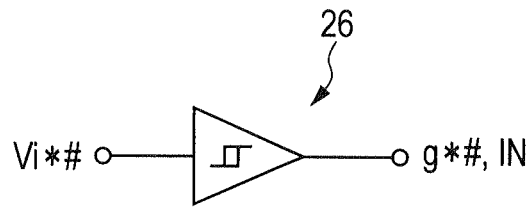
FIG. 3B
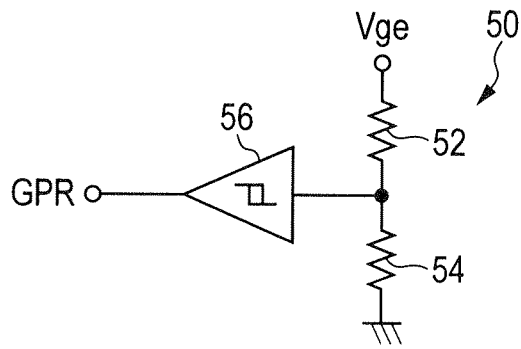
FIG. 4A
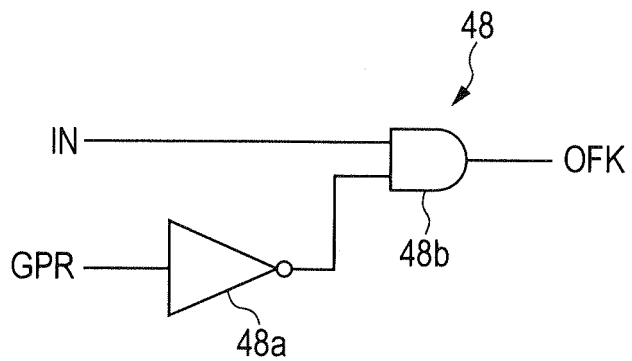
FIG. 4B
| IN | GPR | OFK |
|----|-----|-----|
| L  | L   | L   |
| L  | H   | L   |
| H  | L   | H   |
| H  | H   | L   |

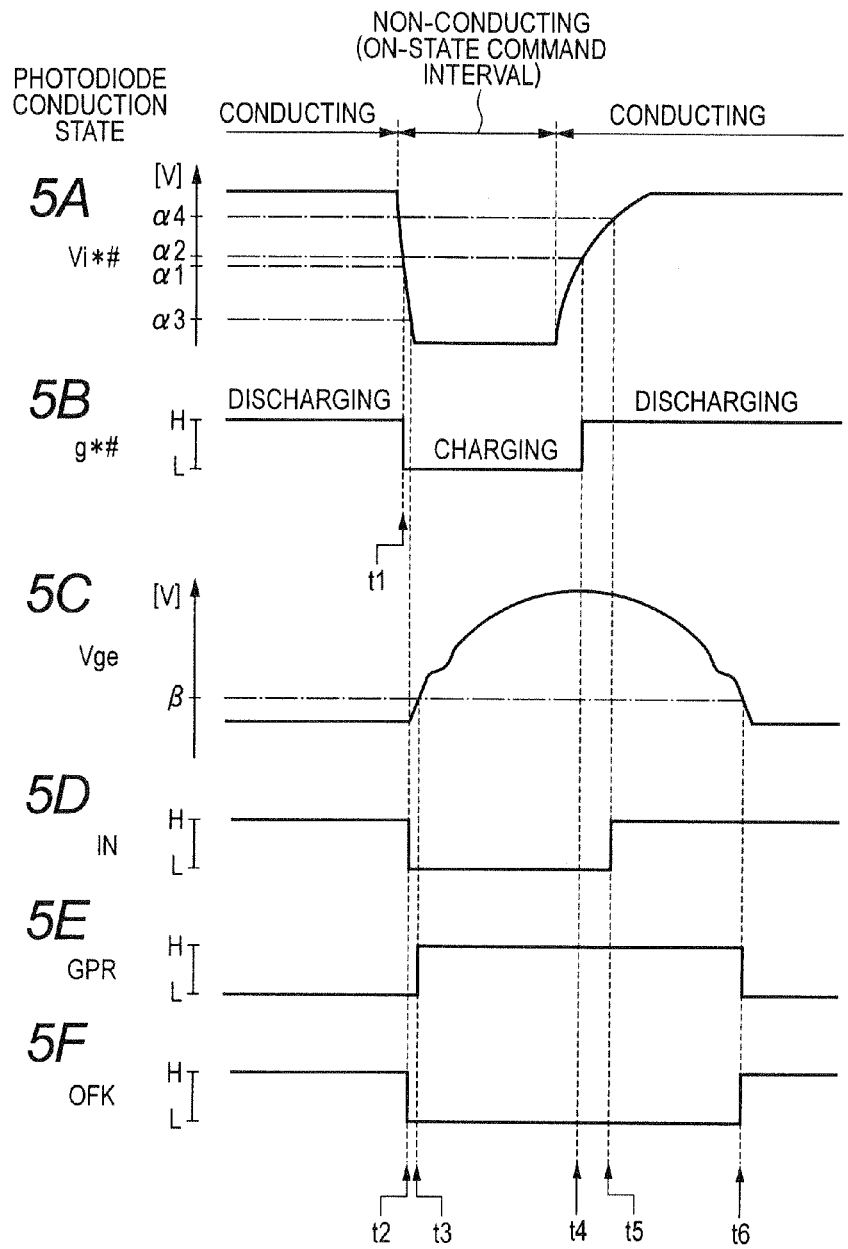

DRIVE CIRCUIT FOR VOLTAGE-CONTROL TYPE OF SEMICONDUCTOR SWITCHING DEVICE

CROSS-REFERENCE TO RELATED APPLICATIONS

This application is based on and incorporates herein by reference Japanese Patent Application No. 2011-111247 filed on May 18, 2011.

BACKGROUND

1. Field of Application

This disclosure relates to a drive circuit configured as an integral unit, for driving a voltage-control type of semiconductor switching device.

2. Background Technology

As described for example in Japanese patent No. 3430878, types of drive circuit are known for use in for on/off switching of an IGBT (insulated gate bipolar transistor) is which functions as a switching device in an electrical power converter circuit, whereby the IGBT is set in the on state by supplying a charging current to the gate of the IGBT (i.e., to charge the gate capacitance) via a charging circuit path, and is switched to the off state by passing a discharge current from the gate via a discharge circuit path. The gate voltage is thereby raised to an on-state value by supplying charge to the gate, and is lowered to an off-state value by discharging the gate charge. Abrupt initiation or abrupt interruption of a flow of collector current of the IGBT is thereby avoided.

Stray capacitances exist between the gate and the emitter and collector of the IGBT, and any noise voltages between the emitter and collector may become applied to the gate via the stray capacitances. This may cause variations in the gate voltage while the IGBT is in the off state, causing a danger that the IGBT may accidentally enter the on state.

To overcome this problem it has been proposed to provide a switching device (referred to in the following as an off-holding switching device) connected in a circuit path other than the charging circuit path and the discharge circuit path, which can be controlled to apply a short-circuit between the gate and emitter of the IGBT, and an off-holding circuit for selectively setting the off-holding switching device in on and off states. That is, the off-holding switching device is set in the on (short-circuit) state while the IGBT is required to be in the off state, and set in the on (open-circuit) state while the IGBT is to be in the on state. Accidental switch-on of the IGBT can thereby be prevented.

However the assignees of the present invention have found a basic problem with that method of preventing accidental switch-on. As described hereinafter referring to a specific example, the off-holding switching device may accidentally enter the on state during discharging of the gate capacitance of the IGBT, before the gate capacitance has become completely discharged. Thus a short-circuit may be prematurely applied between gate and emitter of the IGBT, before the gate voltage has become sufficiently low IGBT. This can result in abrupt interruption of the collector current of the IGBT, causing voltage surges to be applied to the IGBT, and hence possibly causing damage or reduced reliability.

SUMMARY

Hence it is desired to overcome the above problem, by providing a drive unit for a voltage-control semiconductor switching device such as an IGBT whereby voltage surges due to the cause described above can be prevented.

The disclosure provides a drive circuit for driving a voltage-control type of semiconductor switching device (referred to in the following as the driven switching device) comprising signal generator circuitry, drive circuitry, voltage detection circuitry (i.e., gate voltage detection circuitry, when the driven switching device is an IGBT), an off-holding switching device, and off-holding circuitry. The signal generator circuitry receives an external input signal which defines an on-state command interval.

When an on-state command interval has commenced, the signal generator circuitry initiates supplying of a charging current to the control terminal of the driven switching device, for gradually increasing the control terminal voltage from a low (off-state) value to a high (on-state) value (at which the driven switching device fully enters the on state). Following the end of the on-state command interval, the signal generator circuitry enables a discharge current to flow from the control terminal of the driven switching device, for decreasing the control terminal voltage to the off-state value. The off-holding switching device is connected directly between the control terminal of the driven switching device and a circuit point held at the off-state voltage value. While the voltage detection circuit detects that the control terminal voltage of the driven switching device is below a threshold value, and the discharge current flow is enabled, the off-holding switching device is held in the on state. While the voltage detection circuit detects that the control terminal voltage is above the threshold value, or the charging current flow is enabled, the off-holding switching device is held in the off state.

Designating a point at which the control terminal voltage begins to increase from its off-state value (due to commencement of the charging current flow) as the first time point, and designating a second time point as the subsequent point at which the voltage detection circuit detects a transition of the control terminal voltage from being below to above the threshold value, the invention ensures that the delay between the first and second time points is made substantially shorter than the minimum possible duration of an on-state command interval.

This is ensured by configuring the voltage detection circuitry to achieve a higher response speed (reduced delay time) than is achieved with prior art technology.

Abrupt lowering of the control terminal voltage of the driven switching device (due to the off-holding switching device being prematurely returned to the on state) is thereby prevented, so that consequent damage or lowered reliability of the driven switching device can be avoided.

The signal generator circuitry and the voltage detection circuitry are preferably each based upon an identical circuit configuration, producing respective output signals at a H (high) logic level or L (low) logic level in accordance with respective input voltages.

The control signal generator circuitry and the voltage detection circuitry may for example be based on Schmitt trigger circuits. Preferably, the Schmitt trigger circuit of the voltage detection circuitry is configured to have a substantially small amount of hysteresis, for thereby enabling the control terminal voltage of the driven switching device to be compared with a single threshold value.

Alternatively, the control signal generator circuitry and the voltage detection circuitry may comprise respective differential-pair circuits as described in the following, each configured to produce an H or L logic level output signal based on comparing the corresponding input voltage with a predetermined reference voltage.

BRIEF DESCRIPTION OF THE DRAWINGS

FIGS. 3A and 3B respectively show the circuit configurations of a gate voltage detection circuit and a signal generating section of the first embodiment;

FIG. 4A is a circuit diagram of an off-holding circuit of the first embodiment, and FIG. 4B is a table showing input/output logic level relationships for an off-holding circuit of the first embodiment;

FIGS. 5A to 5F are timing diagrams for illustrating the operation of the first embodiment;

DESCRIPTION OF PREFERRED EMBODIMENTS

Figure 1:
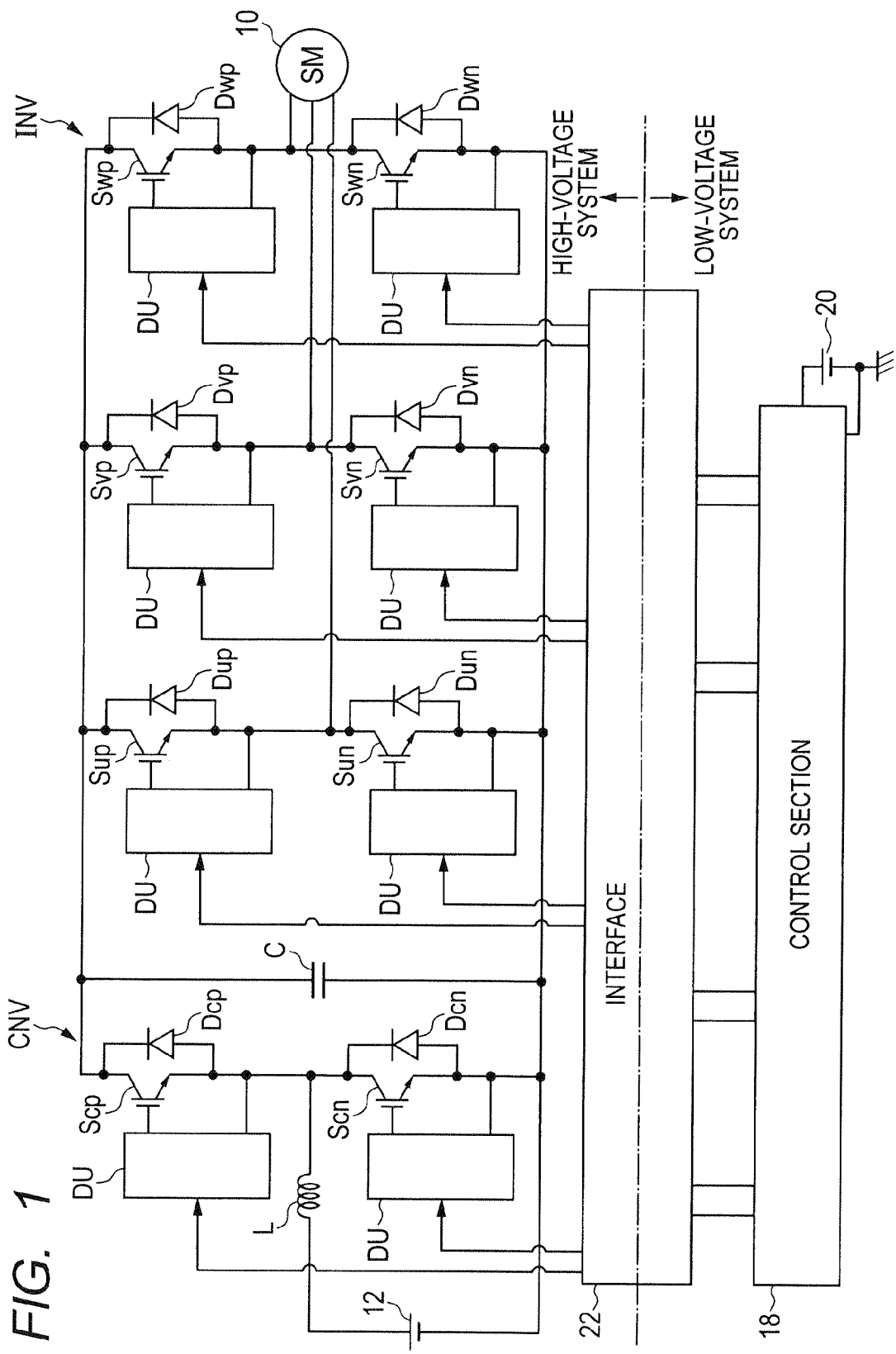
FIG. 1 is a system diagram showing an electrical power converter system for operating a motor-generator of a vehicle.

A first embodiment of a drive unit for a switching device will be described, with the embodiment applied in an electrical power converter for a motor-generator of an electrically-driven a vehicle. FIG. 1 shows the overall configuration of the electric power converter system.

A motor-generator 10 shown in FIG. 1 applies motive power to the vehicle wheels (not shown in the drawings), and is connected via an inverter INV and a voltage step-up converter CNV to a high-voltage battery 12. The voltage step-up converter CNV includes a capacitor C, and a pair of switching devices Scp and Scn series-connected in parallel with the capacitor C. The junction of the switching devices Scp, Scn is connected via an inductor L to the positive terminal of the high-voltage battery 12. When the motor-generator 10 is supplying motive power, the voltage step-up converter CNV is controlled to boost the voltage of the high-voltage battery 12 (e.g., 100 V or more) to a predetermined upper limit voltage (e.g., 666 V).

The inverter INV includes a series-connected pair of switching devices Sup, Sun, a series-connected pair of switching devices Svp, Svn, and a series-connected pair of switching devices Swp, Swn. The respective junction points of these series-connected pairs of switching devices are connected to the U, V and N phases of the motor-generator 10. In the following, the general designation S*# is applied to the switching devices of the voltage step-up converter CNV and inverter INV (*=u, v, w, c; #=p, n). With this embodiment, the switching devices S*# are respective IGBTs (insulated gate bipolar transistors). Also as shown in FIG. 1, diodes D*# are respectively connected with reverse polarity between the collector and emitter terminals of the switching devices S*#.

The system of FIG. 1 further includes a control section 18 and an interface 22, and a low-voltage battery 20 which supplies power to operate the control section 18. The control section 18 is coupled via the interface 22 for controlling the voltage step-up converter CNV and inverter INV, to control the operation of the motor-generator 10. Specifically, the control section 18 (acting via the interface 22) controls on/off switching of the switching devices Scp, Scn in the voltage step-up converter CNV, and of the switching devices Sup, Sun, Svp, Svn, Swp, Swn in the inverter INV.

The interface 22 serves to electrically insulate the high-voltage system of the voltage step-up converter CNV and inverter INV (operated by power supplied by the high-voltage battery 12) from the low-voltage system of the control section 18 (operated by power supplied by the low-voltage battery 20), while transferring signals between the high-voltage system and low-voltage system. With this embodiment, the interface 22 employs photo-couplers to effect these insulation and signal transfer functions.

A first embodiment of a drive unit (DU) will be described, referring first to the block diagram of FIG. 2. The drive unit DU is implemented as a 1-chip integrated circuit, designated as the drive IC 24, together with two DC power sources 25 and 28.

The drive unit includes a signal generating section 26 a drive control section 34, an off-holding circuit 48 and a gate voltage detection section 50, together with resistors 30 and 32, a p-channel MOS FET (metal oxide semiconductor field-effect transistor) 36 and a n-channel MOS FET 42. The power source 25 is connected via the series-connected resistors 30 and 32 to the input terminal of the signal generating section 26. The junction of the resistors 30 and 32 is connected via a terminal T1 of the drive IC 24 and the secondary side (photodiode 23) of a corresponding photo-coupler of the interface 22 to ground (i.e., to the ground potential of the drive unit). The primary side (photo-emissive diode 23) of each photo-coupler is connected to the control section 18.

When no current is being passed through the photo-emissive diode 27 corresponding to the photodiode 23, the photodiode 23 remains in the non-conducting condition. The voltage of the power source 25 is thereby applied to the input terminal of the signal generating section 26, i.e., the input voltage Vi*# of the signal generating section 26 becomes high. When current is passed through the photo-emissive diode 27, rendering it conductive, the input terminal of the corresponding signal generating section 26 thereby becomes connected to ground via the resistor 30 and the photodiode 23. The input voltage Vi*# thus becomes low.

Based on the input voltage Vi*#, each signal generating section 26 generates operation signals for executing on/off switching of corresponding one of the driven switching device S*#, i.e., operation signals gcp, gcn for the switching devices Scp, Scn respectively of the voltage step-up converter CNV, and operation signals gup, gun, gvp, gvn, gwp and gwn, for the switching devices Sup, Sun, Svp, Svn, Swp, Swn respectively of the inverter INV. The operation signals gcp, gcn, gup, gun, gvp, gvn, gwp and gwn are collectively designated as g*# in the following, where "*" and "#" have the significances indicated hereinabove.

Circuit diagrams of the signal generating section 26 and gate voltage detection section 50 of this embodiment are shown in FIGS. 3A, 3B respectively, and examples of signals produced in the drive IC 24 shown in the timing diagrams of FIGS. 5A to 5F. With the signal generating section 26 of this embodiment, two Schmitt trigger circuits are used to respectively generate operation signals g*# and IN, in response to variation of the input voltage Vi*#. Only generation of the operation signal g*# will be specifically described.

Use of a Schmitt trigger circuit results in threshold value hysteresis for the signal generating section 26. The hysteresis enables the effects of electrical noise (superimposed on the input signal Vi*#) to be suppressed, and also provides increased response speed (decreased response time) of the signal generating section 26. The threshold values with respect to the operation signal g*# are designated as α1 and α2, while those for the operation signal IN are designated as α3 and α4.

When the input voltage Vi*# changes from being higher than to lower than the No. 1 threshold value α1, the operation signal g*# changes from the H to L logic level. Conversely when Vi*# changes from being lower than to higher than the No. 2 threshold value α2, the signal g*# changes from the L to the H level. The high-potential side operation signals g*#p (for controlling the driven switching devices Scp, Sup Svp, Swp) and the low-potential side operation signals g*#n (for controlling the driven switching devices Scpn Sun Svn, Swn) are complementary signals.

The operation signal g*# is inputted to the drive control section 34, which drives the corresponding driven switching device S*# accordingly, as described in the following.

The power source 28 supplies a fixed voltage (e.g., 15 V) and is connected via the p-channel MOS FET 36 to terminal T2 of the drive IC 24, which is connected via an external resistor 38 to the gate of the driven switching device SW. In the following, the to circuit path from the power source 28 via the p-channel MOS FET 36, terminal T2 and resistor 38 to the gate of the driven switching device S*# is referred to as the charging path.

The gate of the driven switching device S*# is also connected via a discharging resistor 40 to terminal T3 of the drive IC 24. Terminal T3 is connected internally in the drive IC 24, via the n-channel MOS FET 42, to terminal T4. The terminal T4 is connected to the output terminal (i.e., emitter) of the driven switching device SW. A capacitor 44 is connected between the gate and emitter of the driven switching device SW. The circuit path from the gate of the driven switching device S*# via the resistor 40, terminal T3, and n-channel MOS FET 42 to the terminal T4 is referred to in the following as the discharge path.

The drive control section 34 executes complementary driving of the charging resistor 38 and n-channel MOS FET 42, in accordance with the operation signal g*# from the signal generating section 26. Specifically, when the driven switching device S*# is to be in the on (conducting) state, signal g*# is set at the L logic level, causing output signals from the drive control section 34 to drive the switching devices 36 and 42 to the on and off states respectively. The gate capacitance of the driven switching device S*# thereby becomes charged by current flowing in the charging path, so that the gate voltage of the driven switching device is gradually increased to the on-state value (i.e., value thereof at which the driven switching device is fully in the on state). Conversely, when the driven switching device S*# is to be in the off (non-conducting) state, signal g*# is set at the H logic level, causing output signals from the drive control section 34 to drive the switching devices 36 and 42 to the off and on states respectively. The gate capacitance of the driven switching device S*# thereby becomes discharged by current flowing in the discharge path, thereby gradually lowering the gate voltage of the driven switching device to the off-state value thereof (i.e., value at which the driven switching device is completely in the off state). The high-potential side driven switching devices S*#p and the low-potential side driven switching device S*#n are driven to the on state in alternation with one another.

With this embodiment, charging of the gate capacitance of the driven switching device S*# occurs when the operation signal g*# is at the L level (i.e., "active-low" drive operation).

This is because, for example if some abnormality of the low-voltage system occurs which causes the corresponding photodiode 23 of the interface 22 to be held in the non-conducting condition, (so that the operation signal g*# becomes fixed at the H level) it is ensured that the gate capacitance of the driven switching device S*# will be discharged. This serves to prevent problems such as lowering of the reliability of the driven switching devices.

Figure 2:
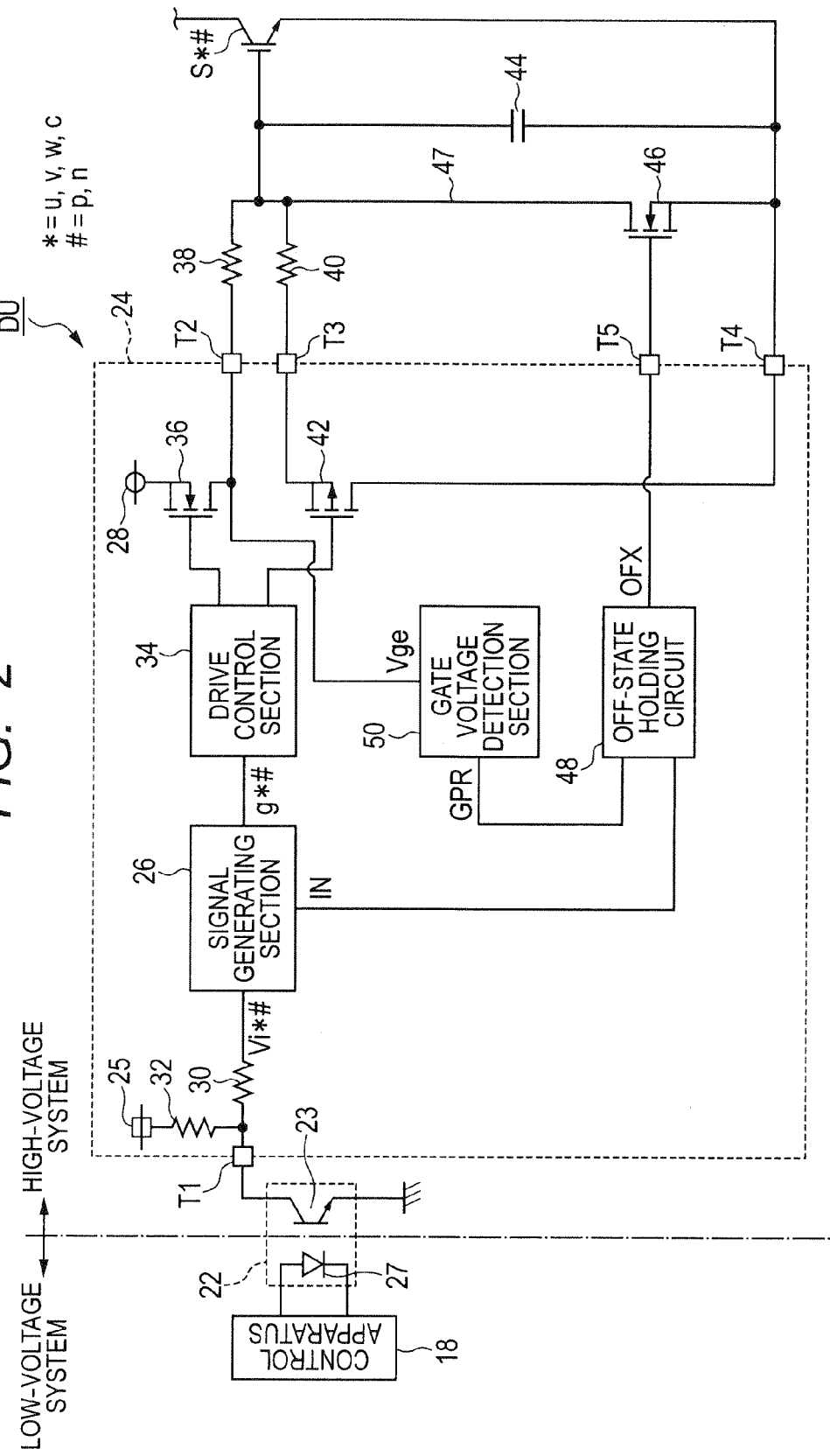
FIG. 2 is a circuit diagram of a first embodiment of a drive unit, for incorporation in the electric power converter system of FIG. 1.

As shown in FIG. 2, each drive unit DU is provided externally with an off-holding switching device 46 (with this embodiment, an n-channel MOS FET), controlled by a signal OFK from the off-holding circuit 48 to be set in an on (conducting) state while the driven switching device S*# is to be held in the off state, and to otherwise remain in an off (non-conducting) state. The off-holding switching device 46 is connected directly between the gate and emitter of the driven switching device S*#, and is located as closely as possible to the driven switching device S*# and terminal T4, to minimize the resistance of the circuit path between the gate and emitter of the driven switching device S*# (via the off-holding switching device 46) when the off-holding switching device 46 is in the on state. This ensures that after the operation signal g*# has set the driven switching device S*# to the off state, any electrical noise superimposed on the gate voltage of the driven switching device S*# cannot accidentally return that device to the on state.

The gate of the off-holding switching device 46 is connected via terminal T5 of the drive IC 24 to receive the output signal OFK of the off-holding circuit 48. The gate voltage detection section 50 derives an output signal GPR based on detecting the gate voltage Vge of the driven switching device S*#. The off-holding circuit 48 produces the output signal OFK based on the signals GPR and IN, in combination.

In the timing diagrams of FIGS. 5A~5F, FIG. 5A illustrates changes in the input voltage Vi*# of the signal generating section 26, while FIG. 5B shows resultant changes in the operation signal g*# which is inputted to the drive control section 34 from the signal generating section 26. FIG. 5C shows corresponding changes in the gate voltage Vge, FIG. 5D shows corresponding changes in the output signal IN from the signal generating section 26, FIG. 5E shows corresponding changes in the output signal GPR, and FIG. 5F shows corresponding changes in the output signal OFK.

As indicated, variations of the input voltage Vi*# define on-state command intervals (with remaining intervals constituting off-state command intervals, not specifically indicated). Following the start of an on-state command interval, charging of the gate terminal (control terminal) of the driven switching device is commenced, to increase the control terminal voltage from an off-state (low) value thereof to an on-state value thereof (at which the driven switching device becomes fully set in the on state). Following the end of an on-state command interval, discharging of the gate terminal of the driven switching device is commenced, for lowering the control terminal voltage to the off-state value thereof (at which the driven switching device is set in the off state).

Hence, following commencement of an on-state command interval, the operation signal g*# specifies that the driven switching device is to be set in the on state, while following the termination of the on-state command interval, the operation signal g*# specifies that the driven switching device is to be set in the on state.

Furthermore when the minimum possible duration of on-state command interval is utilized, discharging of the control terminal of the driven switching device commences at the point (time point t4), when the gate terminal voltage reaches its on-state value, as in the example of FIGS. 5A~5F.

It is a specific feature of this embodiment that the signal GPR is also generated by a Schmitt trigger circuit in the gate voltage detection section 50. As shown in FIG. 3B, the gate voltage detection section 50 of this embodiment is formed of series-connected resistors 52 and 54 and a Schmitt trigger circuit 56. One end of the series-connected resistors 52 and 54 is connected to the terminal T2, to receive the gate voltage Vge of the driven switching device S*#, while the other end is connected to ground potential. The junction of the resistors 52, 54 is connected to the input terminal of the Schmitt trigger circuit 56, i.e., the gate voltage Vge is voltage-divided before being inputted to the Schmitt trigger circuit 56. The gate voltage Vge is voltage-divided in order to prevent damage to the Schmitt trigger circuit 56, since the input voltage of the Schmitt trigger circuit should not exceed a suitably low value (e.g., 5 V) to ensure reliability. "Vg" in FIG. 5C is to be understood as referring to the voltage-divided gate voltage.

It is a further specific feature of this embodiment that the amount of hysteresis of the Schmitt trigger circuit 56 is made extremely small, such that effectively the circuit has a single threshold value, designated as β in FIG. 5C. That threshold value is set close to the threshold voltage of the driven switching device (IGBT), and is preferably made slightly lower than the estimated value of Miller voltage of the driven switching device. The Miller voltage is a result of the Miller effect, and is a value of gate voltage attained by an IGBT during a transition from the on to off state or from the on to off state. Designating the threshold voltage of the IGBT as Vth, the on-state collector current value of the IGBT as Ic and the current amplification factor of the IGBT as gm, the Miller voltage Vm can be estimated as:

$$Vm = Vth + \sqrt{(Ic/gm)}$$

The variation of the output signal GPR from the gate voltage detection circuit 50 with respect to the (voltage-divided) gate voltage Vge is illustrated in FIG. 5E. As shown, when the voltage-divided gate voltage Vge increases from the off-state (low) value thereof to become higher than the threshold value β, signal GPR becomes inverted from the L to H logic level, while when the voltage-divided gate voltage changes from a is higher level to a lower level than β, signal GPR changes from the H to L logic level.

As shown in FIG. 4A, the off-holding circuit 48 is formed of a NOT circuit 48a which receives the output signal GPR from the gate voltage detection section 50, and an AND circuit 48b which receives the output signal from the NOT circuit 48a and the operation signal IN. The output signal OFK from the off-holding circuit 48 is applied via terminal T5 to the gate of the off-holding switching device 46.

The table of FIG. 4B shows the logic level relationships between the inputs signals IN, GPR of the off-holding circuit 48 and the output signal OFK from that circuit. As shown, while gate capacitance discharging is enabled (signal IN is at the H level) and also the gate voltage threshold value is not detected to be exceeded (signal GPR is at the L level), the off-holding switching device 46 in held in the on state (signal OFK is at the H level). Conversely, while gate capacitance charging is enabled (signal IN is at the L level) or the gate voltage threshold value is detected to be exceeded (signal GPR is at the H level), the off-holding switching device 46 in held in the off state (signal OFK is at the L level).

In the example of FIGS. 5A~5F, at time point t1 the input voltage Vi*# changes from below to above the No. 1 threshold value α1, causing the operation signal g*# to change from the H to the L logic level. Hence a change occurs from enabling discharging the gate capacitance of the driven switching device via the discharge circuit path to charging the gate capacitance via the charging circuit path. Next at time point t2, the input voltage Vi*# changes from being above to below the No. 3 threshold value α3, causing the operation signal IN to change from the H to the L logic level. The output signal OFK from the off-holding circuit 48 thereby becomes inverted from the H to the L level, setting the off-holding switching device 46 in the off (open-circuit) state, allowing the gate voltage Vge to begin to rise from its off-state value.

Thereafter at time point t3, the gate voltage Vge changes from being lower than to higher than the threshold value β, so that the output signal GPR from the gate voltage detection section 50 changes from the L to H logic level. As the gate capacitance charging continues, at time point t4 (following the end of the on-state command interval) the input voltage Vi*# changes from being lower than to higher than the No. 2 threshold value α2, so that the operation signal g*# changes from the L to H logic level. As a result, a change occurs from charging to discharging the gate capacitance of the driven switching device S*#, via the discharging path. The gate voltage Vge thus begins to decrease.

Thereafter at time point t5, the input voltage Vi*# changes from being lower than to higher than the No. 4 threshold value α4, hence the operation signal IN becomes inverted from the L to H logic level. Next at time point t6, the off-holding circuit 48 judges that the gate voltage Vge has changed from being above to below the threshold value β, so that the signal GPR becomes inverted from the H to L logic level. At this time, the operation signal IN is at the H level, and hence the signal OFK becomes inverted from the L to H level, setting the off-holding switching device 46 in the on state.

Hence with this embodiment, the off-holding switching device 46 is appropriately controlled by the off-holding circuit 48. This is due to the fact that not only the signal generating section 26 but also the gate voltage detection section 50 are configured as Schmitt trigger circuits, enabling the gate voltage detection section 50 to have a high speed of response. Hence, the delay between the time point at which the gate voltage rises (from its off-state value) above the gate voltage threshold value (β) and the time point at which the off-holding circuit 48 detects that the Vge is above that threshold value (so that signal GPR changes from the L to H level) can be made sufficiently short, i.e., can be made substantially less than the shortest possible duration of an on-state command interval.

Figure 6:
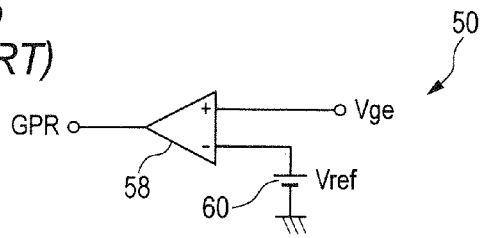
FIG. 6 is a circuit diagram of a gate voltage detection circuit for a drive circuit, used in prior art technology.

FIG. 6 shows an example of a comparator circuit which has been used in the prior art to perform the function of the gate voltage detection section 50 of the above embodiment. In the prior art, the type of comparator utilized for this purpose does not have a sufficient speed of response for the requirements of the present invention, and a resultant problem will be described in the following. In the example of FIG. 6, the inverting input terminal of a comparator 58 is connected to a reference voltage Vref of a voltage source 60, while the non-inverting input terminal is connected to receive the gate voltage Vge of the driven switching device S*#. When the driven switching device is an IGBT as with the above embodiment, the reference voltage Vref can be set at a value slightly lower than the Miller voltage of the IGBT.

When the gate voltage Vge changes from being below to above the reference voltage Vref, the output signal GPR from the comparator 58 becomes inverted from the L to the H level when that change of signal GPR is detected by the comparator 58. However in the prior art, this inversion of signal GPR occurs after an excessive delay, due to a slow speed of response of the comparator 58.

Figure 7A:
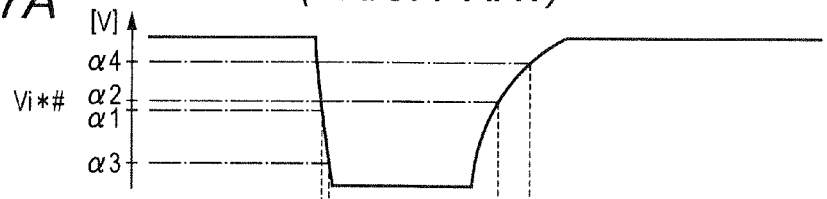
FIGS. 7A to 7F are timing diagrams for illustrating a problem of the prior art.
Figure 7B:
Figure 7C:
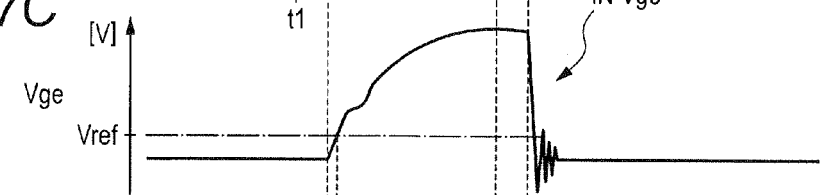
Figure 7D:
Figure 7E:
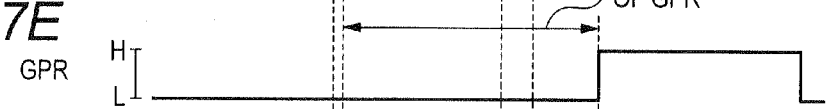
Figure 7F:
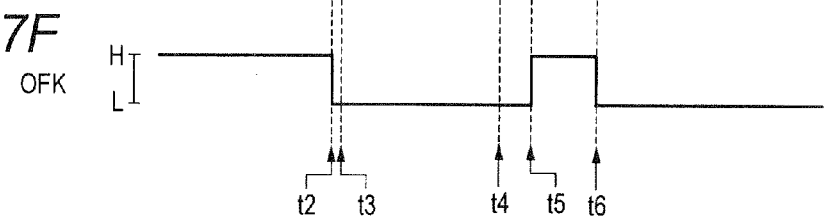

This problem will be described referring to the timing diagrams of FIGS. 7A to 7F. For the purposes of comparison, the circuit configuration of the drive unit DU is assumed to be identical to that of the above embodiment, other than in that the gate voltage detection section 50 utilizes comparator 58 (having insufficient speed of response) in place of the Schmitt trigger circuit 56. The waveforms of FIGS. 7A, 7B and 7D are respectively identical to those of FIGS. 5A, 5B and 5D, and the time points t1 to t5 of FIGS. 7A to 7F respectively correspond to time points t1 to t5 of FIGS. 5A to 5F.

Referring to FIGS. 7A to 7F, at time point t2 the operation signal IN changes from the H to L logic level, and since the output signal GPR from the gate voltage detection section 50 is at the L level, signal OFK from the off-holding circuit 48 changes from the H to L level. At time point t3, the gate voltage Vge exceeds the threshold value Vref. However the gate voltage detection section 50 does not detect this transition until time point t6, i.e., after a significant delay, due to insufficient response speed of the comparator 58.

At time point t5 (when the input voltage Vi*# rises above the threshold value α4) the operation signal IN changes from the L to H level. Since at that time the signal GPR is still at the L level, the signal OFK changes from the L to H level. The off-holding switching device 46 is thereby set in the on (conducting) state, thereby suddenly lowering the gate voltage Vge. At that time Vge is still relatively high, so that a high level of collector current is flowing in the driven switching device S*#. The sudden drop in Vge causes the collector current flow to be interrupted, causing a voltage surge to be applied to the driven switching device S*#. This may result in damage or lowered reliability.

It can thus be understood that there is a basic problem due to implementing gate voltage detection section 50 by a comparator circuit having insufficient speed of response. This results in an excessive delay between the point (t3) at which the gate voltage Vge is detected as increasing above its off-state value (i.e., exceeds the threshold value Vref) and the point (t6) at which the output signal GPR from the gate voltage detection section 50 subsequently becomes inverted from the L to H level due to the increase of Vge. This delay results in the signal OFK prematurely setting the off-holding switching device 46 in the on state (at time point t5), thereby suddenly lowering the gate voltage Vge and so abruptly interrupting a flow of collector current of the driven switching device S*#.

With the above embodiment, this problem is overcome by using a Schmitt trigger circuit to implement the gate voltage detection section 50, so that a sufficiently high speed of response is achieved, and by determining the amount of hysteresis of the Schmitt trigger circuit such that there is only a single threshold value.

Furthermore by using Schmitt trigger circuits to implement the signal generating section 26, since these have a high speed of response, the operation signals g*# and IN can be set to appropriate levels with minimum delays after an on-state command interval begins. Thus a drive unit utilizing the above embodiment can operate appropriately even if the on-state command interval is of very short duration.

Second Embodiment

A second embodiment will be described, based on the points of difference from the first embodiment. Similar circuits (differential-pair circuits) are utilized for producing the operation signals g*# and IN respectively by the signal generating section 26, and for producing the output signal GPR by the gate voltage detection section 50. Hence, only the operation of the signal generating section 26 in producing the signal g*# will be described in detail.

The term "differential-pair circuit" as used in the following description and in the appended claims signifies a circuit having a pair of bipolar transistors with respective emitter terminals connected in common to a current source and having base terminals thereof coupled to receive an input voltage and a reference voltage respectively, and incorporating an output circuit which produces an output signal at the H or L logic level in accordance with the level of collector current of one of the common-emitter transistors.

Figure 8:
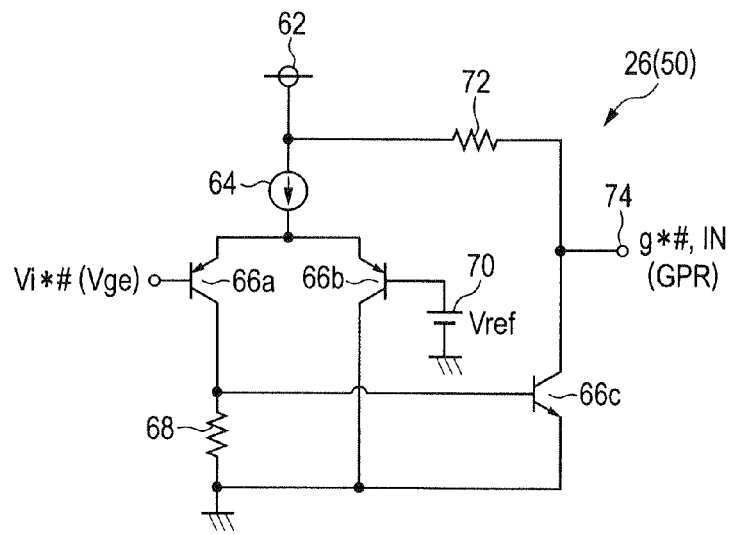
FIG. 8 is a circuit diagram of a gate voltage detection circuit of a second embodiment.

As shown in FIG. 8 the circuit comprises a power source 62, a pair of switching devices (PNP transistors) 66a and 66b referred to in the following as the No. 1 and No. 2 switching devices respectively, connected in common-emitter configuration, a stabilized-current source 64 connected between the power supply 62 and the common-emitter connection of the switching devices 66a, 66b, a resistor 68 connected between the collector terminal of the No. 1 switching device 66a and ground, and a No. 3 switching device (NPN transistor) 66c. A resistor 72 is connected between the DC power source 62 and the collector terminal of the No. 3 switching device 66c, while the collector terminal of the No. 1 switching device 66a is connected to the base terminal of the No. 3 switching device 66c, and the collector terminal of the No. 2 switching device 66b is connected to ground.

The input voltage Vi*# is applied to the base terminal of switching device 66a, is while the base terminal of the switching device 66b receives the reference voltage Vref from a reference voltage source 70. In the case of the signal generating section 26, the reference voltage Vref is set at a value which is lower by a predetermined amount than the value attained by the input voltage Vi*# when the corresponding photo-diode 23 is non-conducting. For example the reference voltage Vref may be set midway between the voltage of the power source 25 and the voltage value which becomes inputted to the signal generating section 26 under the condition that the photodiode 23 is in the conducting state, i.e., when the input of the signal generating section 26 terminal becomes connected to ground via the resistor 30 and the (conducting) photodiode 23.

In the case of the differential-pair circuit of the gate voltage detection section 50, an appropriate value for the reference voltage Vref can be determined as described for the reference voltage source 60 in the example of FIG. 6 above.

With this configuration, when the input voltage Vi*# moves from below to above the reference voltage Vref, the collector current of the No. 2 switching device 66b becomes increased and that of the No. 1 switching device 66a is correspondingly decreased. The base current supplied to the No. 3 switching device 66c thereby becomes decreased, setting that that device in the off state. The voltage of the power source 62 is thereby applied to the output terminal 74, i.e., the operation signal g*# is produced at the H logic level.

When the input voltage Vi*# changes from above to below the reference voltage Vref, the collector current of the No. 1 switching device 66a becomes increased, thereby increasing the base current of the switching device 66c, so that the output terminal 74 becomes set at ground potential, i.e., the operation signal g*# is changed to the L logic level.

Hence with this embodiment, the operation signals g*#, IN and GPR are generated by respective differential-pair circuits, which can have a sufficiently high speed of response for achieving the objectives of the present invention. In particular, if the gate voltage detection section 50 is configured in accordance with this embodiment, the delay from the point at which the gate voltage Vge rises above the reference voltage Vref until the subsequent point at which the output signal GPR from the gate voltage detection section 50 thereafter becomes inverted (as a result of the increase in Vge) can be made shorter than the minimum possible duration of an on-state command interval.

Third Embodiment

A third embodiment will be described, with the description based on the points of difference from the second embodiment.

Figure 9:
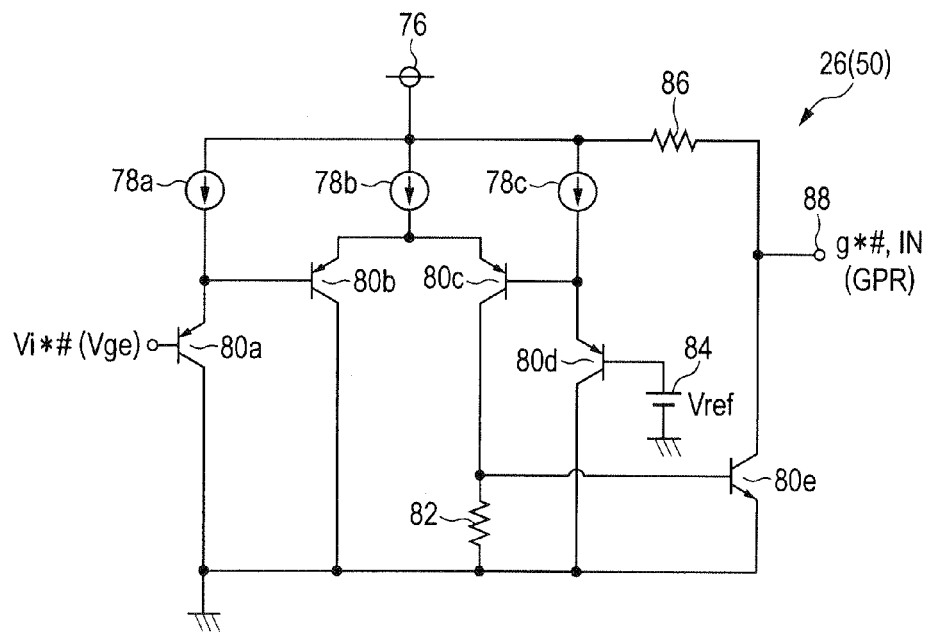
FIG. 9 is a circuit diagram of a gate voltage detection circuit of a third embodiment.

With the third embodiment, each of the signal generating section 26 and gate voltage detection circuit 50 is configured as shown in FIG. 9, as a Darlington-connection differential-pair circuit, in place of the differential-pair circuit of the second embodiment.

The third embodiment will be described only for the circuit which generates the operation signal g*# in the signal generating section 26. The circuit contains four PNP bipolar transistors designated as the No. 1~No. 4 switching devices 80a~80d, a power source 76, stabilized current sources 78a~78c each supplied from the power source 76, a reference voltage source 84 and a resistor 82. The No. 2 and No. 3 switching devices 80b, 80c are connected in common-emitter configuration, with the emitters connected to the stabilized current source 78b.

The collector terminal of No. 2 switching device 80b is connected directly to ground, and the collector terminal of No. 3 switching device 80c is connected to ground via the resistor 82. The stabilized current source 78a is connected to ground via the No. 1 switching device 80a, while the stabilized current source 78c is connected to ground via the No. 4 switching device 80d. The junction of the stabilized current source 78a and the No. 1 switching device 80a is connected to the base terminal of the No. 2 switching device 80b, while the junction of the stabilized current source 78c and the No. 4 switching device 80d is connected to the base terminal of the No. 3 switching device 80c.

In addition, a resistor 86 and a NPN bipolar transistor (No. 5 switching device) 80e are connected between the power source 76 and the circuit ground, with the base terminal of the No. 5 switching device 80e connected to the junction of the No. 3 switching device 80c and the resistor 82. The junction of the resistor 86 and the No. 5 switching device 80e is connected to an output terminal 88. The reference voltage Vref of the reference voltage source 84 is applied to the base terminal of the No. 4 switching device 80d, while the input voltage Vi*# is applied to the base terminal of the No. 1 switching device 80a.

With this configuration, when the input voltage Vi*# rises from below to above the reference voltage Vref, the collector current of the No. 2 switching device 80b becomes increased, thereby decreasing the base current of the No. 5 switching device 80e, setting that device in the off state. The potential of the output terminal 88 thereby is changes from ground potential to that of the power source 76, i.e., the output signal g*# becomes inverted from the L to the H logic level.

Conversely when the input voltage Vi*# falls from above to below the reference voltage Vref, the collector current of the No. 3 switching device 80c becomes increased, thereby increasing the base current of the No. 5 switching device 80e, and so setting that device in the on state. The output signal g*# thereby becomes inverted from the H to the L logic level.

If the gate voltage detection section 50 is configured in accordance with this embodiment, the delay from the point at which the gate voltage Vge rises (from its off-state value) above the threshold value Vref until the subsequent point at which the output signal GPR from the gate voltage detection section 50 becomes inverted can be made shorter than the minimum possible duration of an on-state command interval.

Fourth Embodiment

A fourth embodiment will be described, with the description based on the points of difference from the second embodiment.

With the fourth embodiment, the signals g*#, IN and GPR are generated by respective differential-pair circuits, each formed of NPN bipolar transistors, in place of the differential-pair circuits of the second embodiment. Only the operation for generating the signal g*# is described in the following.

Figure 10:
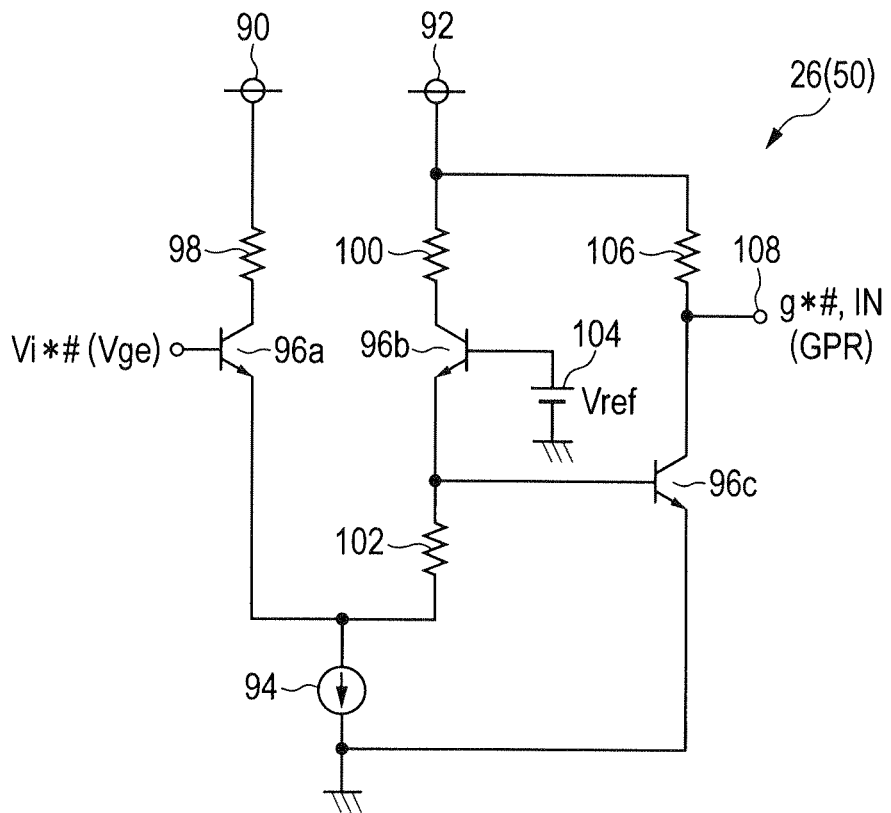
FIG. 10 is a circuit diagram of a gate voltage detection circuit of a fourth embodiment.

Specifically as shown in FIG. 10, the differential-pair circuit of this embodiment includes power sources 90 and 92, a stabilized current source 94, and three NPN bipolar transistors designated as switching devices 96a~96c respectively. A resistor 98 is connected between the power supply 90 and the collector terminal of the No. 1 switching device 98, while the emitter of the No. 1 switching device 96a is connected to ground via the stabilized current source 94. A resistor 100 is connected between the power supply 92 and the collector terminal of the No. 2 switching device 96b, while the emitter of the No. 2 switching device 96b is connected to ground via a resistor 102 and the stabilized current source 94.

The reference voltage Vref of a voltage source 104 is applied to the base terminal of the No. 2 switching device 96b, while the input voltage Vi*# is applied to the base terminal of the No. 1 switching device 96a. The junction of the power supply 92 and the resistor 100 is connected to ground via a resistor 106 and the No. 3 switching device 96c, i.e., with the collector and emitter of the No. 3 switching device 96c being is respectively connected to the resistor 106 and to ground. The base terminal of the No. 3 switching device 96c is connected to the junction of the No. 2 switching device 96b and the resistor 102. An output terminal 108 is connected to the junction of the resistor 106 and the No. 3 switching device 96c.

When the input voltage Vi*# rises from below to above the reference voltage Vref, the collector current of the No. 1 switching device 96a becomes increased, thereby reducing the current which flows from the No. 2 switching device 96b to the base terminal of the No. 3 switching device 96c, which is thereby changed from the on to the off state. The potential of the output terminal 108 thereby changes from ground potential to the potential of the power supply 92, i.e., the output signal g*# becomes inverted from the L to the H logic level.

Conversely when the input voltage Vi*# falls from above to below the reference voltage Vref, the collector current of the No. 1 switching device 96a becomes decreased, thereby increasing the current which flows from the No. 2 switching device 96b to the base terminal of the No. 3 switching device 96c, which is thereby changed from the off to the on state. The potential of the output terminal 108 thereby changes from the potential of the power supply 92 to ground potential, i.e., the operation signal g*# becomes inverted from the H to the L logic level.

As with the preceding embodiments, if the gate voltage detection section 50 is configured in accordance with the fourth embodiment, the delay from the point at which the gate voltage Vge rises above the threshold value Vref until the subsequent point at which the output signal GPR from the gate voltage detection section 50 becomes inverted can be made shorter than the minimum possible duration of the on-state command interval.

Fifth Embodiment

A fifth embodiment will be described, in which the signals g*#, IN from the signal generating section 26 and signal GPR from the gate voltage detection section 50 are generated using respective comparator circuits, each configured to operate in a similar manner to a Schmitt trigger circuit.

The description will first be given for the case of the operation signal g*#, referring to the circuit diagram of FIG. 11. The comparator circuit of this embodiment is based on an operational amplifier 110 having a resistor 114 connected between the output terminal and non-inverting input terminal, and having a reference voltage Vref applied to the inverting input terminal by a reference voltage source 112. In the case of the signal generating section 26, the resistor 30 (shown in FIG. 2 above) is connected to the non-inverting input terminal of the operational amplifier 110.

Designating the threshold levels for the input voltage Vi*# as an upper limit voltage $V_{tH}$ and lower limit voltage $V_{tL}$, the values of $V_{tH}$ and $V_{tL}$ are determined by the respective values of the reference voltage Vref and resistors 114 and 30.

Figure 11:
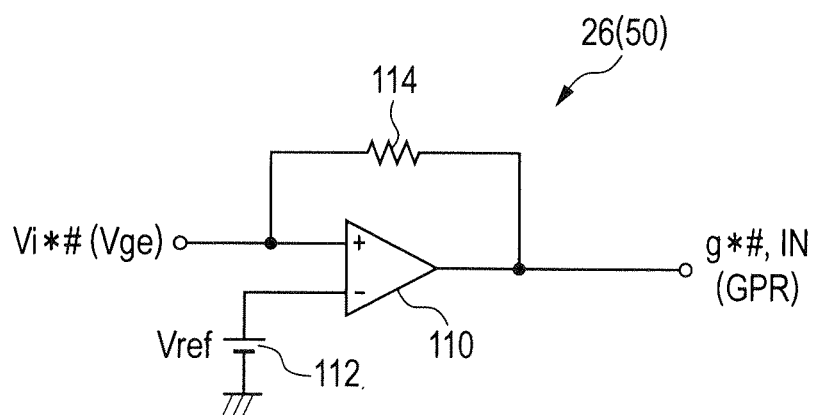
FIG. 11 is a circuit diagram of a gate voltage detection circuit of a fifth embodiment.

The circuit configuration of the gate voltage detection section 50 is identical to that shown in FIG. 11, but with the gate voltage Vg being applied to a resistor which is connected to the non-inverting input terminal of the operational amplifier 110, i.e., performing a similar function to that of the resistor 30.

With this circuit, in the case of the signal generating section 26, if the input voltage Vi*# rises above the upper limit value $V_{tH}$ while the output of the operational amplifier 110 is at the L logic level, the output signal of the operational amplifier 110 switches from the L to the H logic level. When the input voltage Vi*# falls below the lower limit value $V_{tL}$, the output signal switches from the H to the L logic level.

As with the preceding embodiments, if the gate voltage detection section 50 is configured in accordance with the fifth embodiment, the delay from the point at which the gate voltage Vge rises above the threshold value Vref until the point at which the output signal GPR from the gate voltage detection section 50 thereafter becomes inverted can be made shorter than the minimum possible duration of the on-state command interval.

It should be noted that the operation signal IN of the above embodiments is not essential, and may be omitted. That is, the operation signal g*# may also be supplied to the off-holding circuit 48 in place of the signal IN. The off-holding switching device 46 will thereby be held in the on state under the condition that gate capacitance discharging is enabled (signal g*# at the H level) while also the gate voltage Vge is detected to be below the threshold value β (signal GPR at the L level).

Hence since the operation signal IN is not essential to the invention, the term "operation signal" in the appended claims is to be understood as corresponding to the operation signal g*# of the described embodiments.

Furthermore in the appended claims, the terms "off-state voltage" and "on-state voltage" of a control terminal (gate terminal) of a switching device respectively correspond to the voltage levels attained by the gate of a driven switching device of the above embodiments when the gate capacitance is fully discharged and fully charged, respectively.

Alternative Embodiments

Various modifications or alternative forms of the above embodiments may be envisaged, for example as follows.

If a comparator circuit can be provided which has a sufficient response speed for achieving the objectives of the present invention, it would be possible to use such a comparator circuit to implement the gate voltage detection section 50 as shown in FIG. 6. It might also be possible to also utilize such comparator circuits to implement the signal generating section 26.

As described above, the essential requirement for achieving the objectives of the present invention is that the delay time of the gate voltage detection circuit 50 is made sufficiently short. Specifically, the delay from the point at the gate voltage Vge moves from below to above the threshold value for the driven switching device until the subsequent point at which that transition of Vge is detected by the gate voltage detection circuit 50 (so that the level of signal GPR becomes inverted) is made shorter than the minimum possible duration of an on-state command interval.

So long as that requirement is satisfied, it is possible to use other types of circuit than those of the above embodiments to implement the signal generator section 26 and the voltage detection section 50. Furthermore it is not essential to use respectively identical types of circuit for these sections. Schmitt trigger circuits, differential-pair circuit circuits and comparator circuits have respective response times which successively increase in that sequence. Thus it would be possible for example to utilize Schmitt trigger circuits in the signal generating section 26 and a differential-pair circuit in the gate voltage detection section 50, or to utilize differential-pair circuits in the signal generating section 26, and a comparator circuit in the gate voltage detection section 50.

In addition to the above requirement concerning the gate voltage detection section 50, it is also necessary for the signal generating section 26 to have a sufficiently high speed of response with respect to producing the operation signal g*#, to prevent excessive delay times in on/off driving of the driven switching device S*# by the switching devices (transistors) 36 and 42.

Furthermore, each of the above embodiments could be modified such that gate capacitance charging is enabled when the operation signal g*# is at the H logic level, i.e., active-high operation. In that case the signal generating section 26 and the drive control section 34 would be configured to be compatible with active-high operation.

Furthermore the invention is not limited to the case in which the gate voltage detection section 50 detects the voltage of the terminal T2 of the drive IC 24. It may be preferable to detect the gate voltage Vge at a position within the off-holding circuit path 47, closer to the gate of the driven switching device than to the off-holding switching device 46.

Furthermore with the above embodiments, the power supply 25 could be provided external to the drive IC 24.

The invention is not limited in application to an IGBT as a driven switching device, and would be equally applicable to driving other types of device such as power MOS field effect transistors, etc.

Furthermore the invention is not limited in application to operating a motor-generator which provides motive power for a vehicle, and could for example be applied to operating the electrical generator of a series-hybrid type of vehicle.

What is claimed is:

1. A drive circuit controllable for operating a driven switching device, the drive circuit comprising
    signal generator circuitry configured to be responsive to an external input signal for generating an operation signal, said operation signal specifying an on state and an off state of said driven switching device during an on-state command interval and an off-state command interval respectively, said command intervals defined by said external input signal, drive circuitry configured to supply a charging current to a control terminal of said driven switching device while said on state is specified by said operation signal, for setting a voltage of said control terminal to an on-state value thereof, and to enable passage of a discharge current from said control terminal while said off state is specified by said operation signal, for setting said control terminal voltage to an off-state value thereof, voltage detection circuitry configured to judge whether said control terminal voltage is above or below a predetermined threshold value, an off-holding switching device connected in an off-holding circuit path between said control terminal and a circuit point held at said off-state value of the control terminal voltage, said off-holding circuit path being separate from each of a charging circuit path and a discharge circuit path respectively utilized by said drive circuitry, and off-holding circuitry coupled to said signal generator circuitry and said voltage detection circuitry, configured to set said off-holding switching device in an off state while said on state of the driven switching device is specified by said operation signal or said control terminal voltage is judged to be above said threshold value, and to set said off-holding switching device in an on state while said off state of the driven switching device is specified by said operation signal and also said control terminal voltage is judged to be below said threshold value;

wherein said control signal generator circuitry and said voltage detection circuitry are respectively configured whereby an interval between a first time point and a second time point is made less than a shortest possible duration of said on-state command interval, said first time point being a point at which said control terminal voltage changes from below to above said threshold value, and said second time point being a subsequent point at which said voltage detection circuitry judges that said control terminal voltage has risen from below to above said threshold value.

2. A drive circuit according to claim 1, wherein said driven switching device comprises an insulated-gate bipolar transistor and wherein said off-holding circuit path extends between a base terminal and an emitter terminal of said insulated-gate bipolar transistor.

3. A drive circuit according to claim 1, wherein said control signal generator circuitry and said voltage detection circuitry have respectively identical configurations, and produced respective output signals at a H (high) logic level and L (low) logic level in accordance with respective input voltages.

4. A drive circuit according to claim 3, wherein said control signal generator circuitry and said voltage detection circuitry comprise respective Schmitt trigger circuits, each configured to produce said output signal thereof based on comparing said input voltage thereof with a predetermined reference voltage.

5. A drive circuit according to claim 3, wherein said Schmitt trigger circuit of said voltage detection circuitry is configured to have threshold values that are substantially coincident.

6. A drive circuit according to claim 3, wherein said control signal generator circuitry and said voltage detection circuitry comprise respective differential-pair circuits configured to produce said output signal thereof based on comparing said input voltage thereof with a predetermined reference voltage.

7. A drive circuit according to claim 3, wherein said control signal generator circuitry and said voltage detection circuitry comprise respective comparator circuits, each configured to produce said output signal thereof based on comparing said input voltage thereof with a predetermined reference voltage.

\* \* \* \* \*